(12) United States Patent
Ng et al.

(10) Patent No.: US 7,458,499 B2
(45) Date of Patent: Dec. 2, 2008

(54) APPARATUS AND METHOD FOR FILLING A BALL GRID ARRAY TEMPLATE

(75) Inventors: Boon Chew Ng, Singapore (SG); Wing Wah Tam, Singapore (SG); Ee Teoh Lim, Singapore (SG)

(73) Assignee: Aurigin Technology PTE Ltd., Techplace 1 (SG)

( * ) Notice: Subject to any disclaimer, the term of this patent is extended or adjusted under 35 U.S.C. 154(b) by 509 days.

(21) Appl. No.: 10/531,611

(22) PCT Filed: Oct. 13, 2003

(86) PCT No.: PCT/SG03/00246

§ 371 (c)(1),
(2), (4) Date: Nov. 4, 2005

(87) PCT Pub. No.: WO2004/035253

PCT Pub. Date: Apr. 29, 2004

(65) Prior Publication Data

US 2006/0169743 A1    Aug. 3, 2006

(30) Foreign Application Priority Data

Oct. 14, 2002    (SG)    .................... 0206254.5

(51) Int. Cl.
*B23K 1/00* (2006.01)
*B23K 35/12* (2006.01)
(52) U.S. Cl. ........................ 228/246; 228/41
(58) Field of Classification Search ............ 228/245, 228/246, 180.22, 41; 438/613–617; 257/737, 257/738; 53/247, 473
See application file for complete search history.

(56) References Cited

U.S. PATENT DOCUMENTS 5,551,216 A * 9/1996 McGill ..................... 53/473

(Continued)

FOREIGN PATENT DOCUMENTS

JP    2001-148395    * 5/2001

(Continued)

OTHER PUBLICATIONS

Derwent Abstract Accession No. 1999-538647/45; Motorolla Inc; Jun. 22, 1999.

(Continued)

*Primary Examiner*—Kevin P Kerns
*Assistant Examiner*—Megha Mehta
(74) *Attorney, Agent, or Firm*—Quarles & Brady LLP (57) ABSTRACT

An apparatus and method for filling a ball grid array template is disclosed. The apparatus comprises a normally horizontal base plate with the ball grid array template being mounted onto the base plate at one end. A solder ball supply bin is slidably mounted over the surface of the base plate. The bin is enclosed on three vertical sides, while the fourth vertical side proximate the ball grid array template is a pivotable ball gate. At rest, the bin is located at an end of the base plate opposite to the template. When the base is tilted, the bin slides from its rest location to the other end of the base plate, so that it is positioned over the template, thereby allowing the solder balls to fill the locating holes of the template. The base is then rotated so that it tilts the opposite way, allowing the bin to return to its rest position. As the bin returns to its rest position, the ball gate sweeps any excess balls on the surface of the template back into the bin. The sensing device monitors the position of the ball gate. If the ball gate is in an open position, this indicates an abnormality in operation.

13 Claims, 8 Drawing Sheets

U.S. PATENT DOCUMENTS

| | | | |
|---|---|---|---|
| 5,941,449 | A | 8/1999 | Le Coz et al. |
| 6,276,598 | B1 | 8/2001 | Chen et al. |
| 6,390,351 | B1 | 5/2002 | Kasai et al. |
| 6,413,850 | B1 * | 7/2002 | Ooroku et al. .............. 438/613 |
| 2003/0127501 | A1 | 7/2003 | Cheng et al. |

FOREIGN PATENT DOCUMENTS

| | | |
|---|---|---|
| JP | 2001-156434 | 6/2001 |
| WO | WO 00/54921 | 9/2000 |

OTHER PUBLICATIONS

"BGA Baller", New Products Section, Circuits Assembly magazine, p. 76, Jul. 1999.
"BGA Reballing", SMT magazine, p. 67, Feb. 2000.
"Patent to Vanguard for BGA Sphere-Attach Process", Briefs section, SMT magazine, Sep. 1996.
Advanced Packaging article. "Void-free, flux-free process for placement and attach of solder balls." Feb. 2000.

* cited by examiner

APPARATUS AND METHOD FOR FILLING A BALL GRID ARRAY TEMPLATE

CROSS-REFERENCE TO RELATED APPLICATIONS

This application claims priority to International Patent Application PCT/SG03/000246 filed 13 Oct. 2003, which claims priority of SG application 0206254-5 filed 14 Oct. 2002.

BACKGROUND OF THE INVENTION

1. Field of the Invention

The present invention generally relates to ball grid array (BGA) and in particular, an apparatus and method for filling a ball grid array template with solder balls.

2. Description of the Prior Art

Ball grid arrays techniques are common nowadays for connecting high-density IC components onto circuit boards. U.S. Pat. No. 5,655,704, issued to Matsushita Electric Industrial Co., 12 Aug. 1997 discloses a method of filling a template or a stencil with solder balls as a sweeping bin passes over the template. However, such method is very susceptible to solder ball damage by the design itself as well as due to process variability, contamination or foreign particle. As a result of the damage, subsequent process becomes not possible or the object of subsequent depositing the solder ball on the BGA package is not possible.

Figure 1:
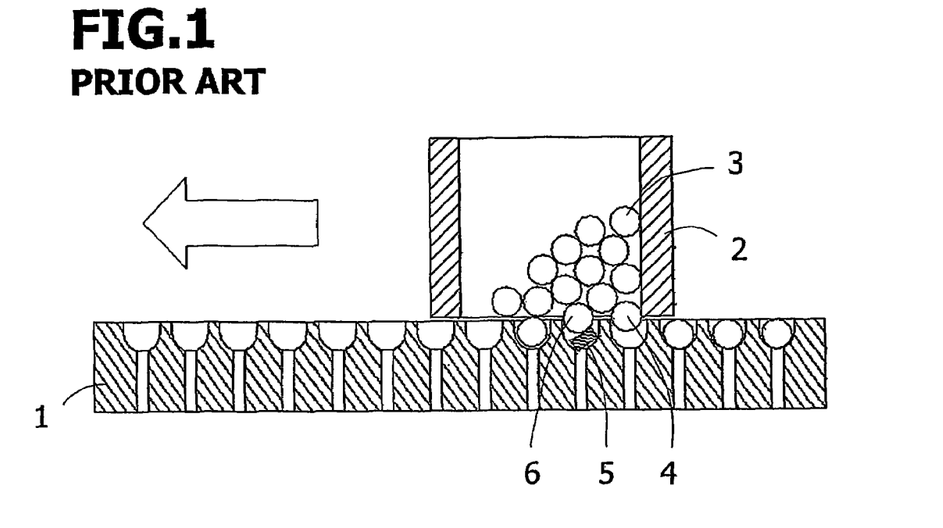
FIG. 1 is a partly enlarged cross-sectional view showing a conventional solder ball mounting apparatus.

FIG. 1 shows a conventional method of filling a BGA template with solder balls. The BGA template 1 is provided with a plurality of holes to receive a plurality of solder balls 3. A ball bin 2 sweeps over and above the template 1 and deposits the solder balls 3 into the holes on the template 1. As this deposition of the solder balls 3 can happen anytime when the solder ball 3 and the hole are aligned, the deposition may take place just as the ball bin 2 is about to reach the particular hole at which the solder ball 4 is just about to drop in. As shown in FIG. 1, this may result in the ball 4 being quashed by the bin 2. Another possible situation is when the solder ball 6 fails to properly seat in the hole due to foreign matter 5. The bin 2 will shear off the top of the solder ball 6.

Figure 2:
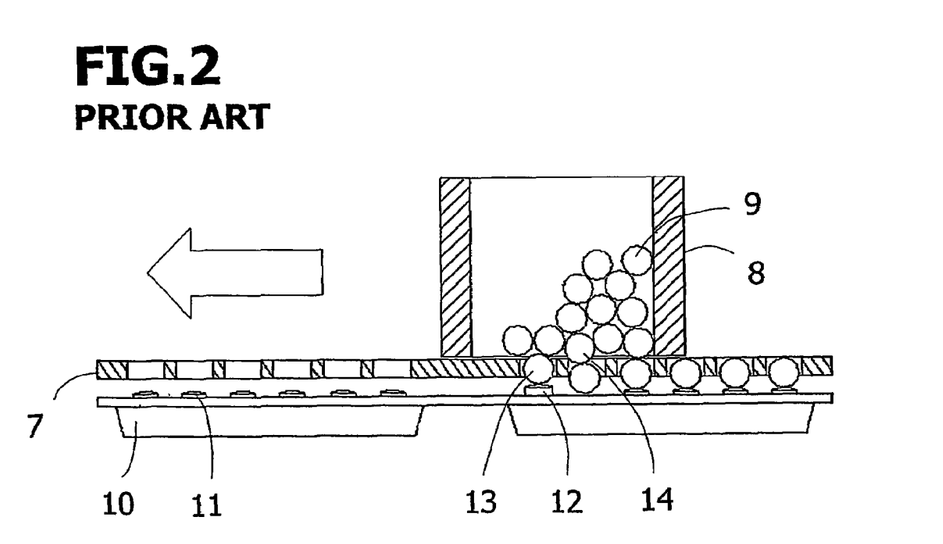
FIG. 2 is a cross-sectional view of another conventional solder ball mounting apparatus.

FIG. 2 is a perspective view showing a solder ball mounting apparatus disclosed in U.S. Pat. No. 5,655,704. As shown in the FIG. 2, the solder balls are deposited onto the substrate 10 through the stencil 7. The flux dots 11 on the substrate hold the solder balls 9 in place. However, as these flux dots 11 are liquid paste, the volume or height of the dot 11 may vary as in the case of flux dot 12, where there is excessive amount. This causes the solder ball 13 to stick out of the stencil 7 and be sheared off at the top as the solder ball bin 8 passes over the ball 13. There can potentially be cases where there is not any flux dots and the solder balls will drop lower than the usual height and the solder ball 14 will be sheared by the bin 8.

U.S. Pat. No. 5,499,487, issued to Vanguard Automation, Inc., 19 Mar. 1996 discloses an apparatus for placing solder balls in a ball grid array. The apparatus comprises a wheel having an inner and an outer face, and the wheel being rotatable about a horizontal axis, means for attaching a ball grid array to the inner face of the wheel, means for attaching a tooling fixture to the outer face of the wheel in a position corresponding to that of the ball grid array, means for forming a reservoir of solder balls at the bottom of the wheel, means for controllably rotating the wheel to move the tooling fixture through the reservoir in a manner to fill recesses in the fixture with solder balls and to remove from the surface of the array any excess solder balls which are not occupying recessed, the inner and the outer faces being separated a distance to permit the tooling fixture to engage solder balls in the reservoir while ball grid array does not engage the solder balls.

U.S. Pat. No. 5,551,216 relates to a method and apparatus for filling a ball grid array. The apparatus comprises a reservoir for solder balls and a tooling plate with an array of holes for receiving solder balls. U.S. Pat. No. 6,276,598 relates to a method and an apparatus for ball placement. The method and apparatus are particularly suitable for transferring solder balls to a ball grid array package.

Figure 3:
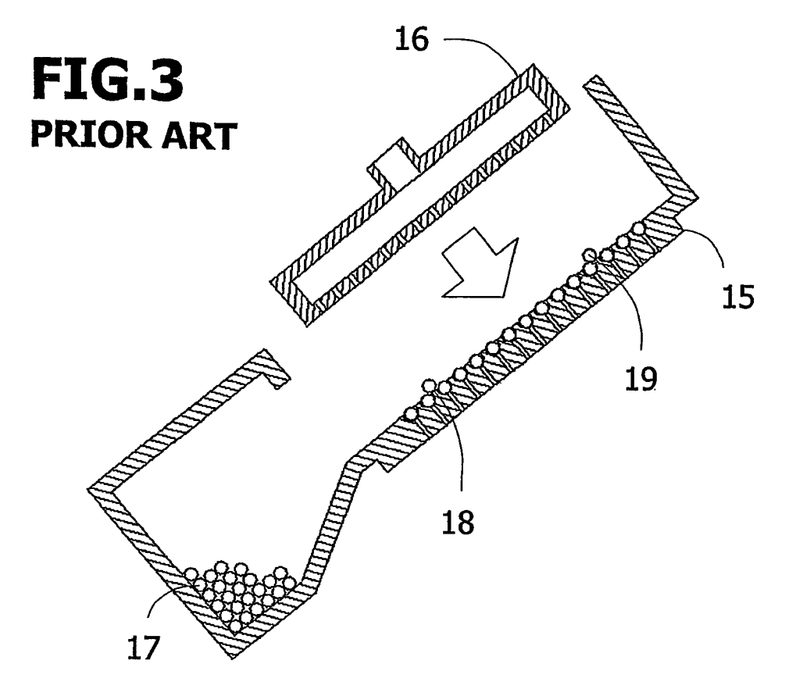
FIGS. 3 and 4 schematically show instances which may result in quashed solder ball or multiple balls at each hole in the pick head or at each electrode on the ball grid array in a conventional solder ball mounting apparatus.
Figure 4:
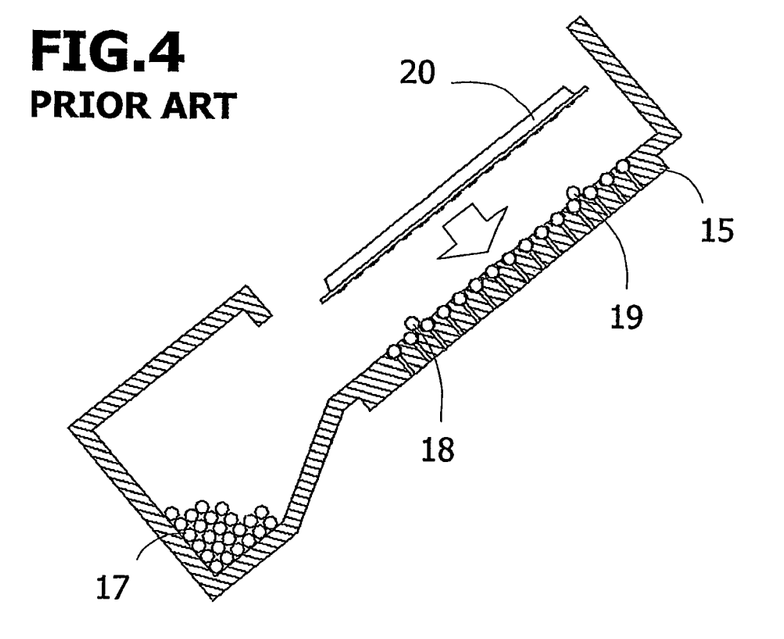

The methods disclosed in the above U.S. Pat. Nos. 5,499,487, 5,551,216, and 6,276,598 make use of free flow of solder balls 17 over tilted templates 15 with or without vacuum suction at the holes receiving the solder balls. This method does not prevent excess solder balls 18 and solder balls 19 remaining on the surface of the template or around the holes due to either static forces, vacuum leakage at holes or foreign matter which may be sticky like flux used in the attachment to the substrate. In these citations, subsequent operation whereby the ball pick head 16 or a ball grid array substrate 20 is advanced above the template will result in quashed solder ball or multiple balls at each hole in the pick head or at each electrode on the ball grid array (as shown in FIGS. 3 and 4).

U.S. Pat. No. 5,918,792, issued to RSVI Vanguard, Inc., 6 Jul. 1999, discloses ball grid arrays and method for placement of solder balls onto the pattern of metallized pads or dots of such arrays. The apparatus comprises an elongated holder defining an elongated recess therein for the carrier of the array, a stencil overlying the recess and supported by guide rails, a block of rigid material having a planar bottom surface contacting the stencil and for movement along the stencil, and means for moving the block along the stencil for moving a bin contacting solder balls over the apertures formed on the stencil for filling the apertures.

SUMMARY OF THE PRESENT INVENTION

Accordingly it is an object of the present invention to provide an apparatus and method for filling a ball grid array template with solder balls. Yet another object of the present invention is to provide an apparatus for filling a ball grid array template having locating holes with a plurality of small solder balls comprising a base plate rotatably mounted at the axis thereof to a controlling device and the ball grid array template being mounted onto the base plate so that the template rotates simultaneously with the base plate;

a ball supply bin slidably mounted over the top surface of the base plate while being rotated together with the base plate, the sliding motion of the ball supply bin being controlled by a driving means such as a motor, and the ball grid array template about the axis of the base plate, and the ball supply bin being substantially rectangular and enclosed on three vertical sides while the fourth vertical side proximity to the ball grid array template being a ball gate, said ball gate pivoted about the axis thereof and being normally rested by a stop pin or the like, such as a stopping edge, positioned at the lower surface of the ball gate;

a sensing device positioned at both the ends of the base plate at a height similar to the height of the ball gate from the base plate for monitoring the opened/closed position of the ball gate; and a plurality of small solder balls enclosed by the ball supply bin thereby when the base plate tilted towards the ball grid array template, the bin supply bin slides to and over the ball grid array template and thereby fill up the locating holes on the template with solder balls, the base plate is then tilted in the opposite direction, the ball supply bin slides back to the other end and simultaneously, the excess solder balls are fallen back with the supply bin.

Yet a further object of the present invention is to provide a method of filling solder balls on a ball grid array template having a plurality of locating holes, said method comprising the steps of:

positioning said ball grid array template at one end of a pivotal base plate;

introducing a plurality of solder balls in a ball supply bin which is slidably positioned at the one end of the base plate, and is slidable on the base plate;

clockwise rotating of the base plate, causing the ball supply bin sliding towards the ball grid array template to allow the solder balls contained in the ball supply bin to fill the locating holes on the template, and the sliding motion of the ball supply bin being controlled by a driving means such as a motor, each solder ball for each locating hole; and counter-clockwise rotating of the base plate and sliding of the ball supply bin back to its initial position and, in so doing, remove any excess solder balls from above the ball grid array template.

A further object of the present invention is to provide an apparatus for filling solder balls on a ball grid array template, further comprising a ball pick head which is lowered above the ball grid template to remove the solder balls by vacuum for transferring to a ball grid array substrate.

Yet another object of the present invention is to provide a method of filling solder balls on a ball grid array template, wherein the base plate is tilted clockwise in an angle ranging from 5 to 40 degree above horizontal.

Yet another object of the present invention is to provide a method of removing excess solder balls from a ball grid array template, wherein the base plate is tilted anti-clockwise in an angle ranging from 20 to 75 degree.

An embodiment of the invention will now be described by way of example and with reference to the accompanying drawings, in which

DETAILED DESCRIPTION OF THE PRESENT INVENTION

While the specification concludes with claims defining the features of the invention that are regarded, it is believed that the invention will be better understood from a consideration of the following description in conjunction with the drawings.

Figure 5:
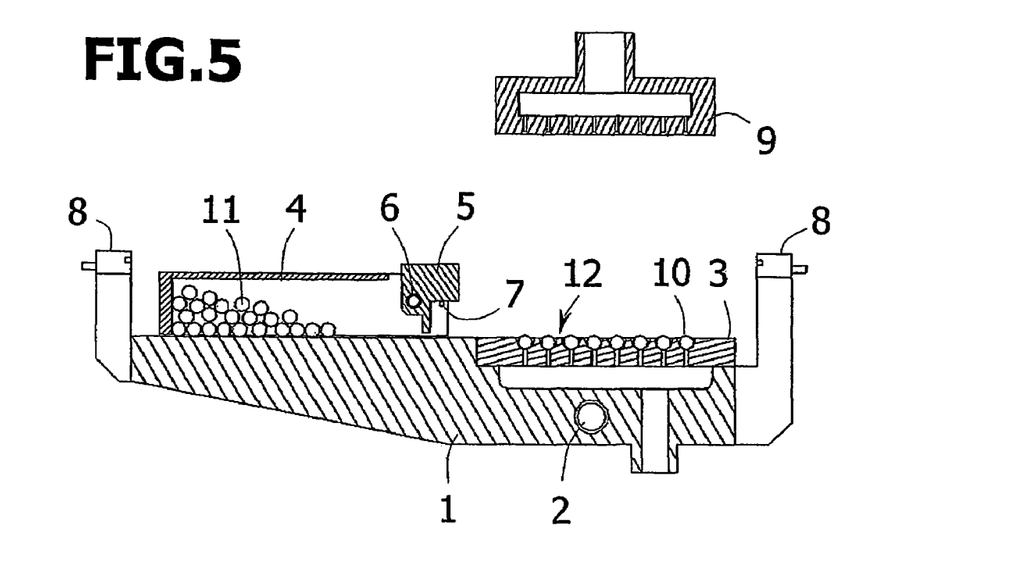
FIG. 5 is a cross-sectional view showing the depositing of solder balls from the ball supply bin to the ball array template in accordance with the present invention.

Referring now to FIG. 5, there is shown an apparatus for filling solder balls on a ball grid array template in accordance with the present invention. The apparatus comprises a base plate 1 rotatably mounted at the axis 2 thereof to a controlling device; a ball grid array template 3 mounted onto the top surface of the base plate 1 at one end thereof so that the ball grid array template 3 rotates simultaneously with the base plate 1 when the base plate 1 rotates (tilts) clockwise or anti-clockwise; a ball supply bin 4 substantially rectangular shape slidably mounted over the top surface of the base plate 1 at the other end thereof and corresponding to the position of the ball grid array template 3 and the ball supply bin is driven by a motor and is moveable along the base plate 1 while the base plate 1 rotates about the axis 2 of the base plate 1. In accordance with the present preferred embodiment, the ball supply bin 4 is enclosed on three vertical sides while the fourth vertical side, proximity to the ball grid array template 3, is provided with a ball gate 5. The ball gate 5 is pivoted about the axis 6 thereof and is normally rested by a stop pin 7 positioned at the lower surface of the ball gate 5 when the base plate 1 rotates clockwise or counter-clockwise. The ball grid array template 3 is provided with a plurality of locating holes 12 on the top surface to hold solder balls 10, and one locating hole 12 receives only one solder ball 10, as shown in FIG. 5.

A sensing device 8, such as a through-beam sensor, or a focused-beam reflective sensor is positioned and supported at both the ends of the base plate 1 at a height similar to the height of the ball gate 5 from the base plate 1 for monitoring the opened/closed position of the ball gate 5. If the ball gate 5 is in an open position, this indicates an abnormality in operation. The ball gate 5 is designed in such a way that the weight of the ball gate 5 is pivoted about the axis 6 and the weight will ensure that the ball gate 5 forms a close wall to contain the solder balls 11 within the ball supply bin 4.

Figure 15:
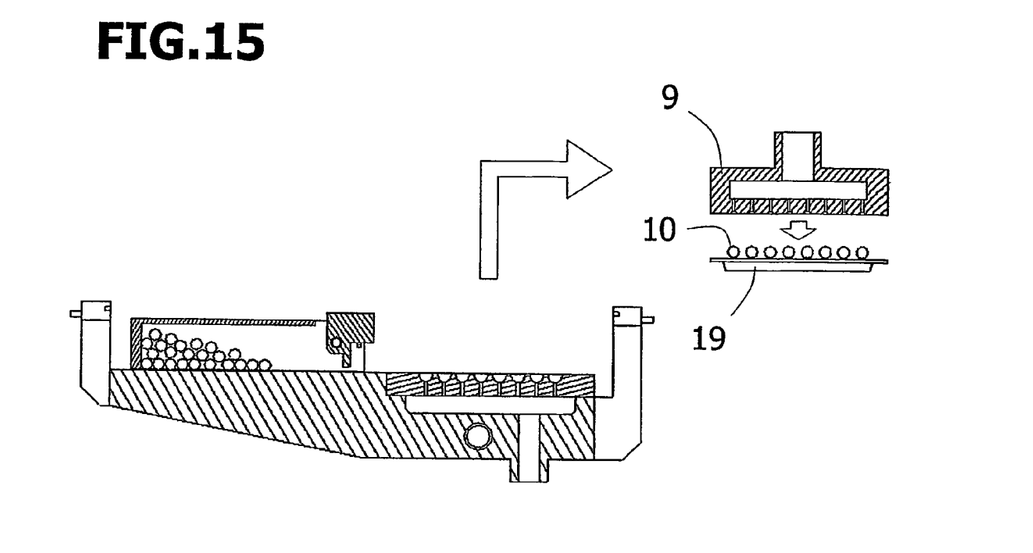

As shown in FIG. 5, a plurality of small solder balls (in bulk) 11 are enclosed by the ball supply bin 4. A ball pick head 9 is positioned above the ball template 3 and is lowered to remove the solder balls 10 on the ball grid array template 3 by vacuuming for transferring to a BGA substrate 19 (referring to FIG. 15).

Figure 7:
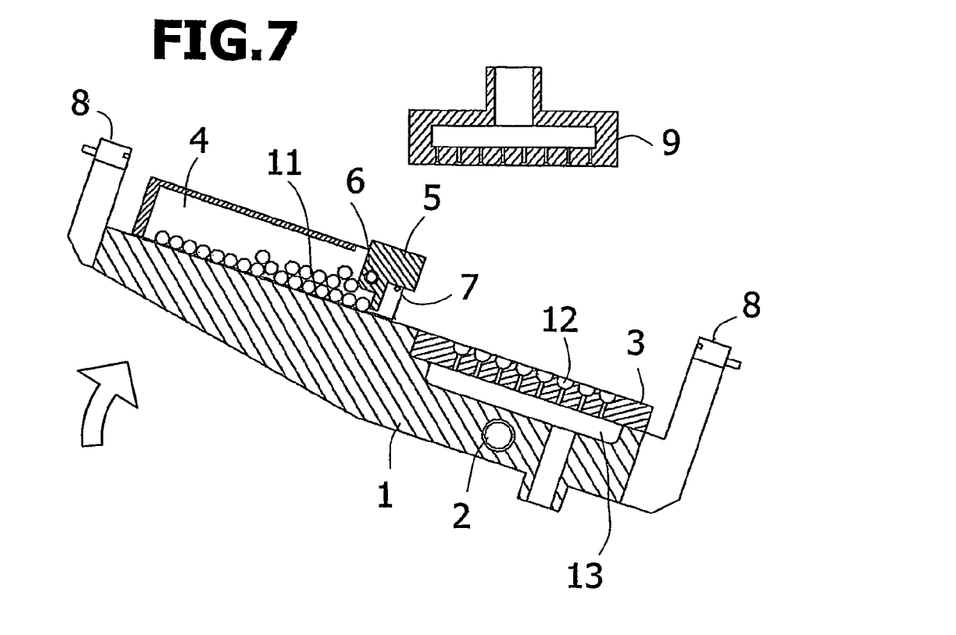
Figure 8:
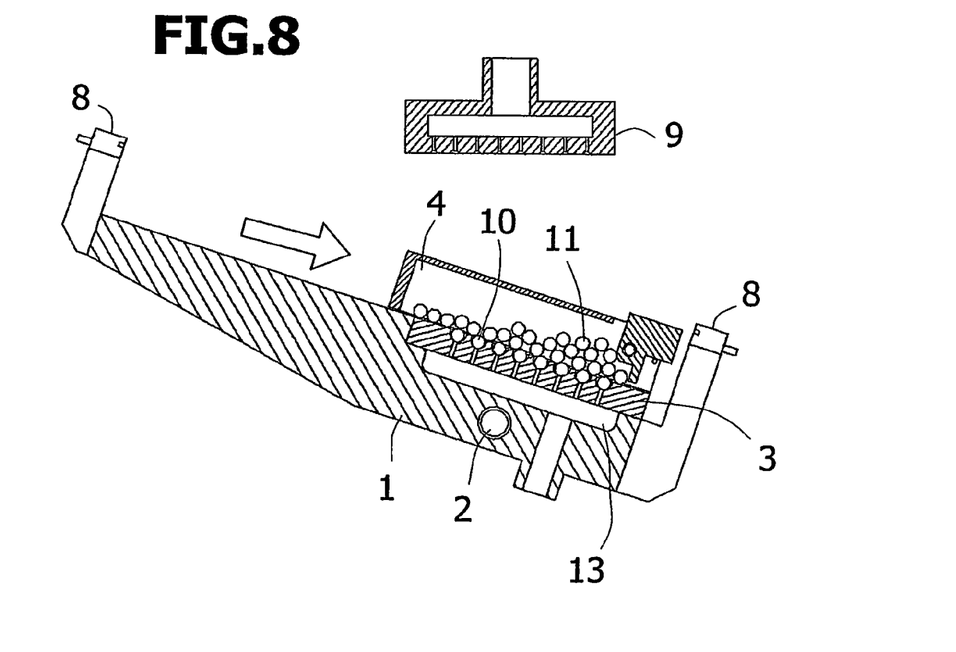

In accordance with the present invention, a vacuum 18 is provided to a chamber 13 underneath the ball grid array template 3, in communication with the individual locating holes 12 on the ball grid array template 3 so as to assist the filling of the solder balls 10 (referring to FIG. 7 and FIG. 8).

FIGS. 7 through 15 depict the operation of the apparatus in accordance with the present invention.

Figure 6:
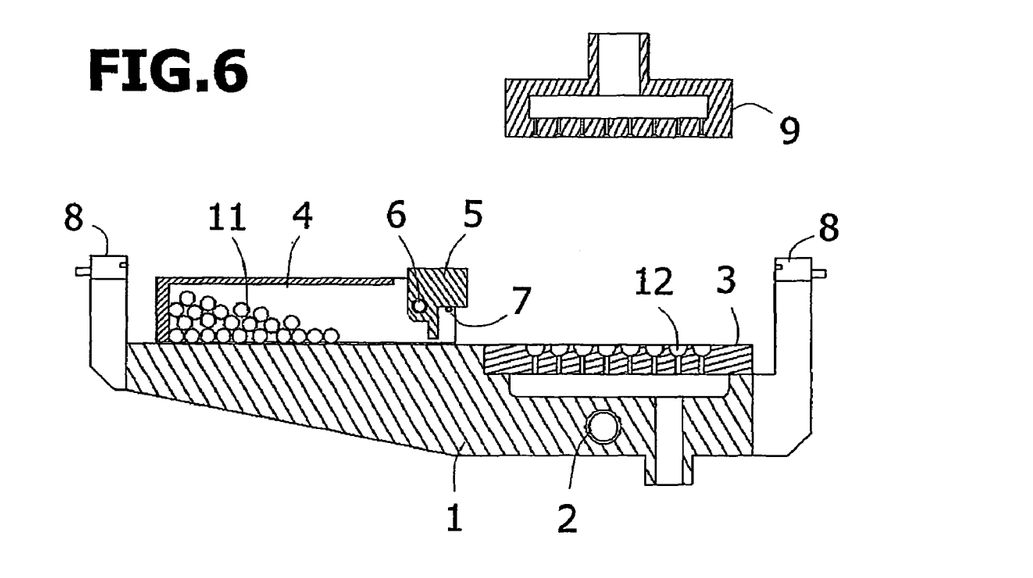
FIGS. 6 to 15 are cross-sectional views showing operation sequence of depositing of solder balls in accordance with the present invention.

At the initial operation of the apparatus, the base plate 1 together with the ball grid array template 3 having no solder balls 10 on the locating holes 12 are in the horizontal position (as shown in FIG. 6). As shown in FIG. 6, the solder balls 11 are contained within the ball supply bin 4 and the ball gate 5 is at the close position.

Referring to FIG. 7, the base plate 1 tilts or is rotated clockwise to about 5 to 40 degree above horizontal. The angle of rotation is determined by the ability of the solder balls 11 within the ball supply bin 4 to spread out towards the ball gate 5 to maximize ball deposition possibility over the ball grid array template 3 in subsequent steps. The ball gate 5 forms a close wall to keep the solder balls 11 within the supply bin 4.

As shown in FIG. 8, the ball supply bin 4 slides towards the ball grid array template 3 and over the template 3 and in so doing, the solder balls 11 within the supply bin 4 are deposited into the locating holes 12 on the surface of the template 3. The vacuuming means 18 connected to the chamber 13 assist in filling the solder balls 10 into the locating holes 12 on the template 3.

Figure 9:
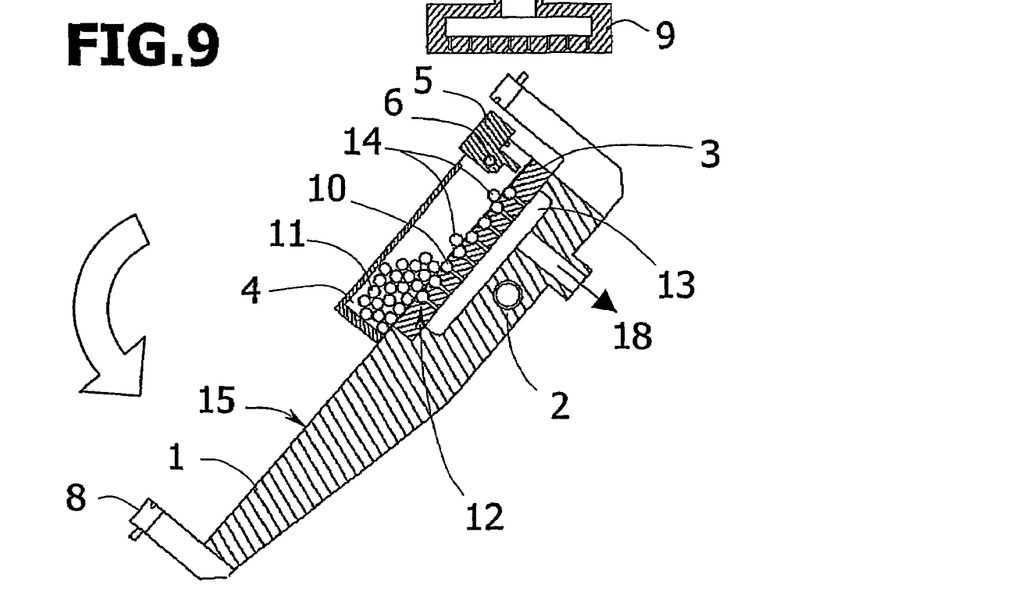

Referring to FIG. 9, the base plate 1 is then tilted or rotated counter-clockwise to about 20 to 75 degree below horizontal. Similarly, the angle of rotation is determined by the ability of the solder balls 11 within the ball supply bin 4 to fall freely by gravity towards the far-end of the bin 4 from the ball gate 5 and by the amount of rotational torque balance at which the ball gate 5 is pivoted about the axis 6.

Due to the fact that the solder balls 11 are typically very small, as small as 0.2 mm diameter, some residual solder balls, denoted as 14, may attach to the surfaces 15 of the base plate 1, the ball grid array template 3 or around the locating holes 12 due to static charges, humidity, contamination or vacuum leakage.

Figure 10:
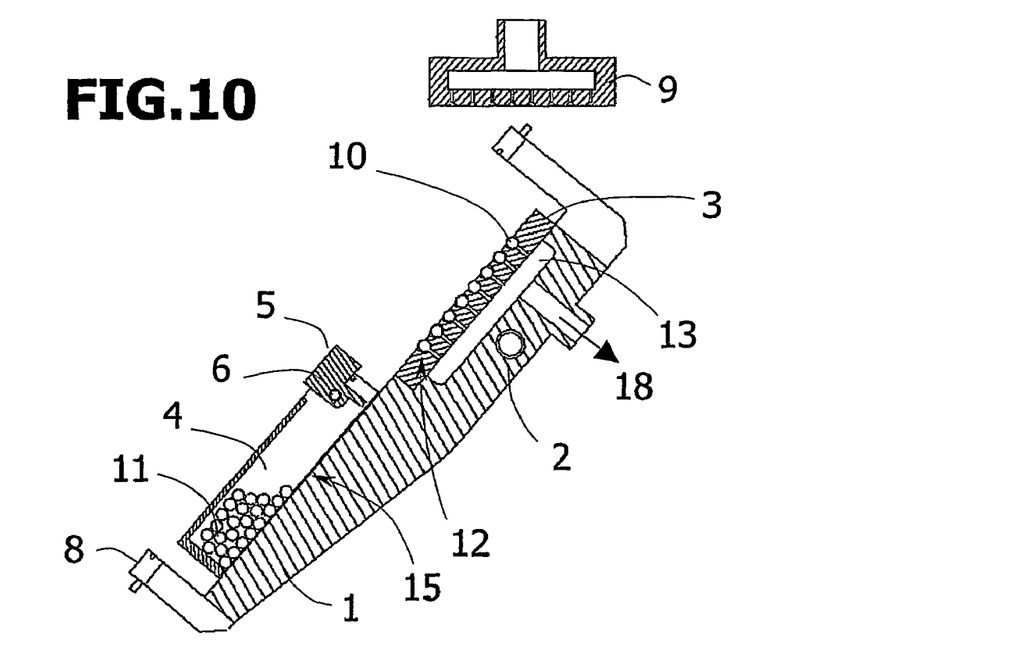
Figure 11:
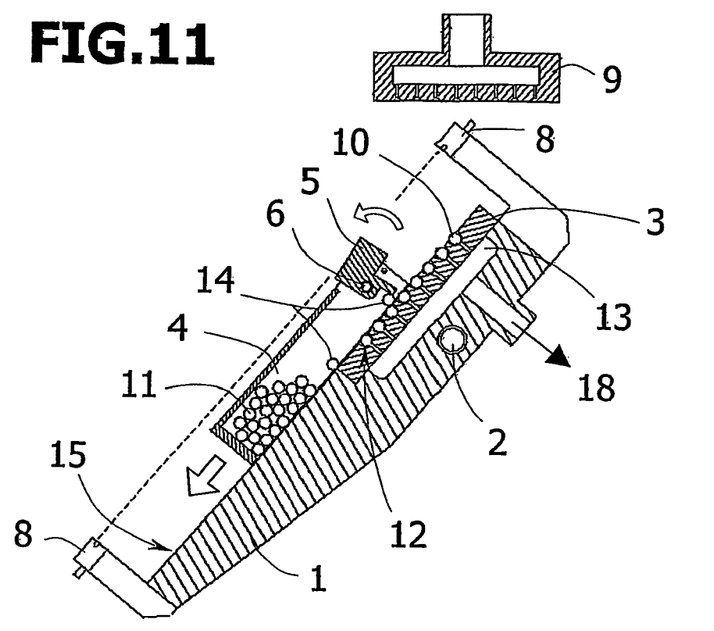
Figure 12:
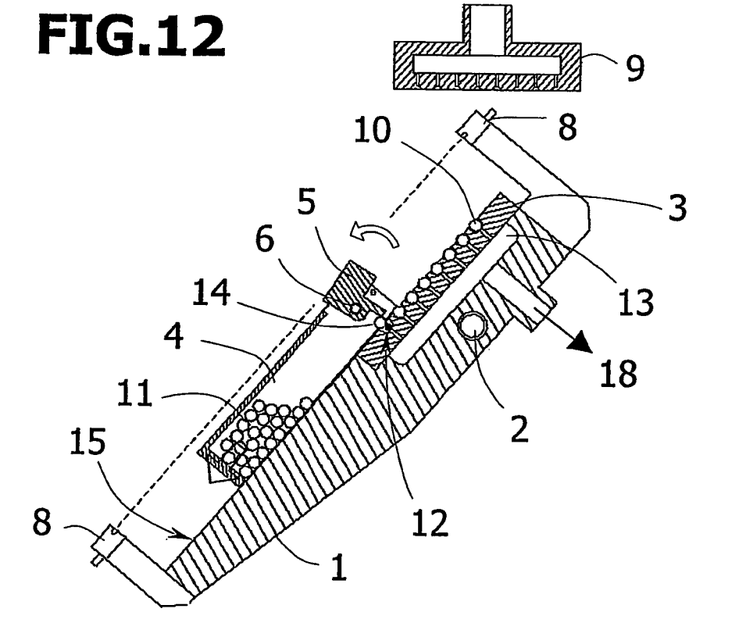
Figure 13:
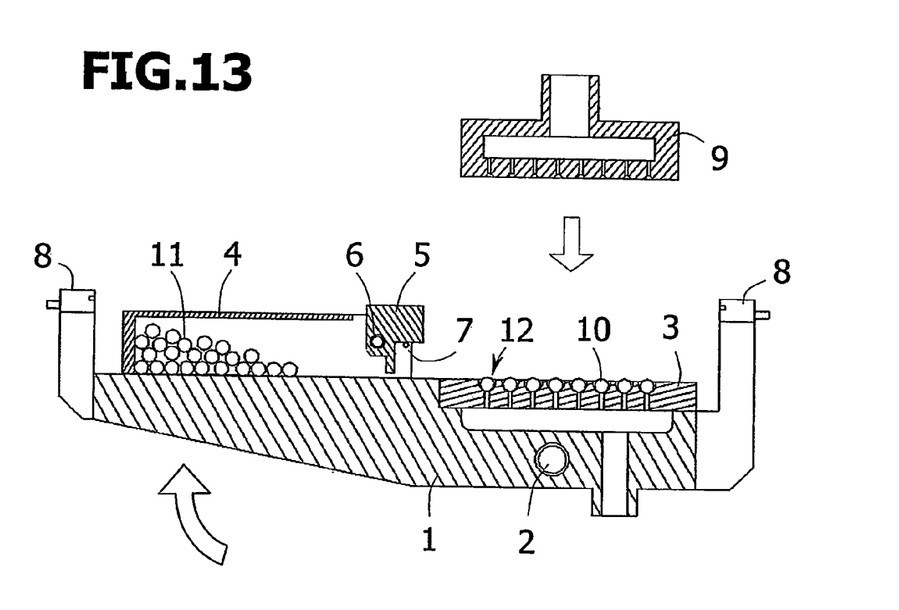
Figure 14:
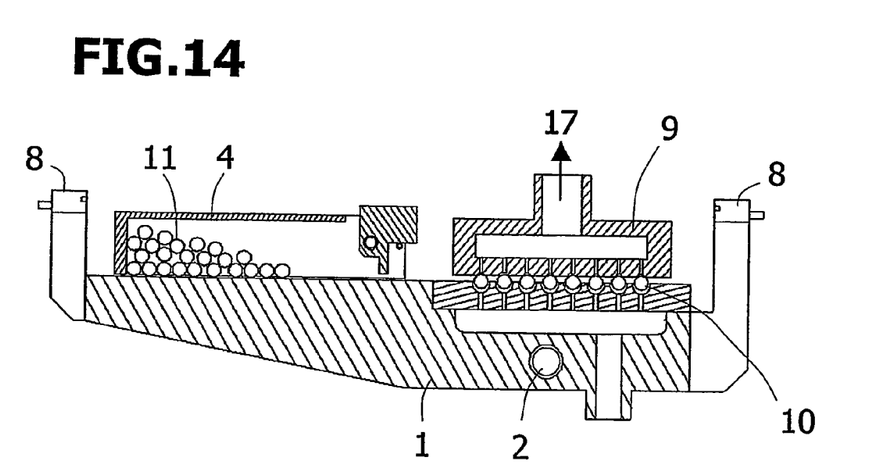

As shown in FIG. 10, at this angular orientation, the ball supply bin 4 slides backwards and in so doing sweeps off excess residual solder balls 14. The solder balls 10 deposited in the locating holes 12 remains in place, held by either vacuum 18 in the chamber 13 or by the depth of the locating holes 12.

The invention claimed is:

1. A solder ball filling apparatus comprising:
    a base plate provided with a ball grid array template on one end having a plurality of locating holes extending therethrough for receiving solder balls, the base plate having pivotal movement about a pivot between a first pivot direction to move solder balls toward the ball grid array template and a second, opposite pivot direction to move solder balls away from the ball grid array template;
    a solder ball supply bin provided on the base plate for holding solder balls therein and for depositing solder balls in one or more of the locating holes when the bin is located above the ball grid array template; and
    a motor capable of moving the solder ball supply bin along the base plate toward and away from the ball grid array template;
    wherein the solder ball supply bin comprises two oppositely disposed side walls respectively connected by a rear side wall at one end and a pivoted ball gate at an opposite end, wherein during pivoting of the base plate in the second direction, the ball gate pivots upon contact with solder balls that have not moved away from the ball grid array template.

2. A solder ball filling apparatus according to claim 1, wherein the rear side wall is disposed at a distance relative to the pivoted ball gate such that when the bin slideably moves on the base plate the rear wall does not slide over the ball grid array template.

3. The apparatus according to claim 1, further comprising a sensing device positioned at both the ends of the base plate, at a height similar to the height of the pivoted ball gate from the base plate.

4. The apparatus according to claim 3, wherein the sensing device is a through-beam sensor or a focused-beam reflective sensor.

5. The apparatus according to claim 1, wherein the base plate is pivoted at an angle ranging from 5 to 40 degrees in the first pivot direction.

6. The apparatus according to claim 1, wherein the base plate is pivoted at an angle ranging from 20 to 75 degrees in the second pivot direction.

7. The apparatus according to claim 1, wherein the locating holes in the ball grid array template are in communication with a vacuum.

8. A method of filling a ball grid array template with solder balls, the ball grid array template being provided on one end of a base plate and having a plurality of locating holes extending therethrough, the base plate being capable of pivotal movement between a first pivot direction and a second, opposite pivot direction, and a solder ball supply bin being provided on a base plate that is capable of sliding thereon in the first and second pivot directions, the method comprising:
    (a) providing solder balls in the solder ball supply bin;
    (b) pivoting the base plate in the first pivot direction to allow solder balls located in the bin to move in the first pivot direction;
    (c) moving the solder ball supply bin over the base plate in the first pivot direction to the ball grid array template to thereby allow solder balls to fill one or more of the locating holes;
    (d) pivoting the base plate in the second pivot direction to allow solder balls located in the bin to move in the second pivot direction away from the ball grid array template; and
    (e) moving the solder ball supply bin over the base plate in the second pivot direction;
    wherein the bin is capable of holding solder balls between two oppositvely disposed side walls respectively connected by a rear side wall at one end and a pivoted ball gate at an opposite end, wherein during step (e) the ball gate pivots upon contact with solder balls that have not moved away from the ball grid array template.

9. The method according to claim 8, wherein the base plate is pivoted at an angle ranging from 5 to 40 degrees in the first pivot direction.

10. The method according to claim 8, wherein the base plate is pivoted at an angle ranging from 20 to 75 degrees in the second pivot direction.

11. The method according to claim 8, further comprising pivoting the base plate to a horizontal position after step (e).

12. The method of claim 8, wherein the first pivot direction is a clockwise direction.

13. The method of claim 8, wherein the second pivot direction is an anti-clockwise direction.

* * * * *